United States Patent [19]

Nagasaki et al.

[11] 3,939,393

[45] Feb. 17, 1976

[54] HIGH VOLTAGE RECTIFYING ARRANGEMENT HAVING A FIXING PIECE FOR AN INPUT TERMINAL

[75] Inventors: Tadashi Nagasaki; Isamu Kimura; Shingo Tamura, all of Yokohama, Japan

[73] Assignee: Hitachi, Ltd., Japan

[22] Filed: Sept. 4, 1973

[21] Appl. No.: 394,255

[30] Foreign Application Priority Data

Sept. 4, 1972   Japan.............................. 47-102398

[52] U.S. Cl............ 321/15; 174/52 PE; 339/147 R
[51] Int. Cl.²......................................... H02M 7/00
[58] Field of Search ....... 174/52 PE; 336/96; 321/2, 321/15; 339/147 R, 147 C, 147 P, 218 R, 218 C, 61 M

[56] References Cited
UNITED STATES PATENTS 3,718,892   2/1973   Burgess et al................... 339/147 R
3,748,538   7/1973   Shekerjian .......................... 321/8 R
3,818,305   6/1974   Dumas................................... 321/15

FOREIGN PATENTS OR APPLICATIONS 1,136,247   9/1962   Germany......................... 339/147 P
124,581     6/1947   Australia........................... 339/218 C

*Primary Examiner*—William M. Shoop
*Attorney, Agent, or Firm*—Craig & Antonelli

[57] ABSTRACT

A high voltage rectifier arrangement for producing a D.C. high voltage necessary for the cathode-ray tube in a television receiver in which a voltage multiplier rectifier composed of a plurality of rectifiers and high voltage condensers is molded with a resin in an insulator case, the input terminal which is to be led out of the insulator case is fixed with a piece formed of a material having good adherence to the molding material, and the led out input terminal and the junction part of the led out input terminal and the lead wire of a flyback transformer are covered with an insulating rubber cap pressed around the piece.

5 Claims, 10 Drawing Figures

HIGH VOLTAGE RECTIFYING ARRANGEMENT HAVING A FIXING PIECE FOR AN INPUT TERMINAL

FIELD OF THE INVENTION

The present invention relates to a high voltage rectifying arrangement useful for television receivers, and more particularly, to an arrangement for producing a high D.C. voltage necessary for a cathode-ray tube by multiply rectifying the output of a flyback transformer with a voltage multiplier rectifying circuit consisting of rectifiers and high voltage condensers.

DESCRIPTION OF THE PRIOR ART

The anode of the cathode-ray tube in television receivers requires a high D.C. acceleration voltage of several tens of kilovolts.

With the tendency of solidification of television receivers the arrangement for producing the high D.C. voltage progressed from the half-wave rectifier circuit employing a vacuum tube to one employing a selenium rectifier and further to one employing a higher ability and higher reliability silicon rectifier. However, the half-wave rectifier circuit employing the silicon rectifier has the disadvantage that the size of the flyback transformer becomes large because the output of the flyback transformer must be substantially equal to the working rectified output. Consequently, a voltage multiplier rectifying method using a voltage doubler rectifying circuit consisting of a plurality of rectifiers and high voltage condensers has recently been considered.

Figure 1:
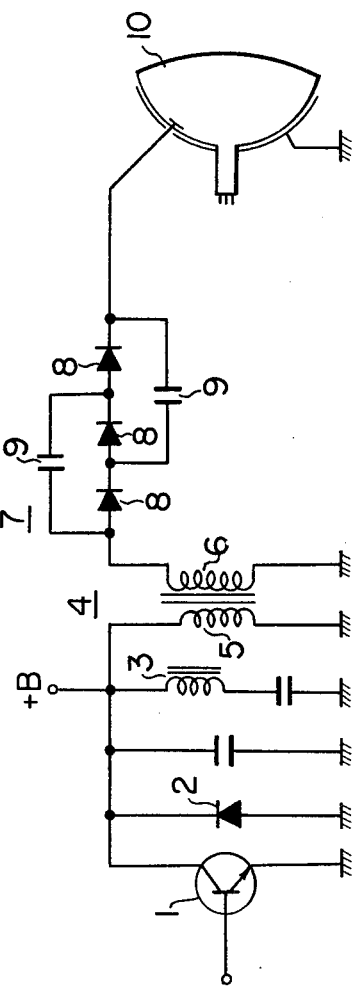
FIG. 1 is a circuit diagram of a known horizontal and a voltage trebler rectifying circuit.

FIG. 1 shows a circuit diagram of a known coupled horizontal deflecting and voltage trebler rectifying circuit. A sawtooth wave current is supplied to a horizontal deflecting coil 3 by periodically operating a horizontal output transistor 1 and a damper diode 2. Pulses produced during the flyback period of the sawtooth wave are coupled with the low voltage winding 5 of a flyback transformer 4 in the A.C. manner, and a pulse voltage stepped-up produced at a high voltage winding 6 is rectified by a voltage trebler rectifying circuit 7 consisting of rectifiers 8 and high voltage condensers 9 to be supplied to the anode of a cathode-ray tube 10.

It is known that the rectifiers 8 and the high voltage condensers 9 constituting the voltage trebler rectifier circuit 7 are entirely molded in an insulating resin or immersed in an insulating oil because packaging them in a television receiver with their electrode part in the exposed state is dangerous due to the possibility of corona discharge or discharge between their electrodes.

Figure 2:
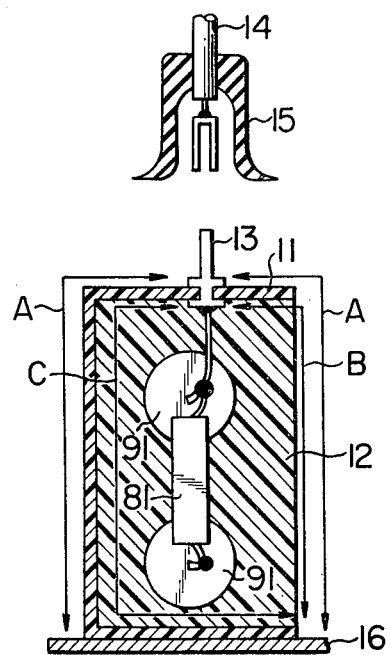
FIGS. 2 and 3 are side views, in cross-section, of conventional high voltage rectifier arrangements.
Figure 3:
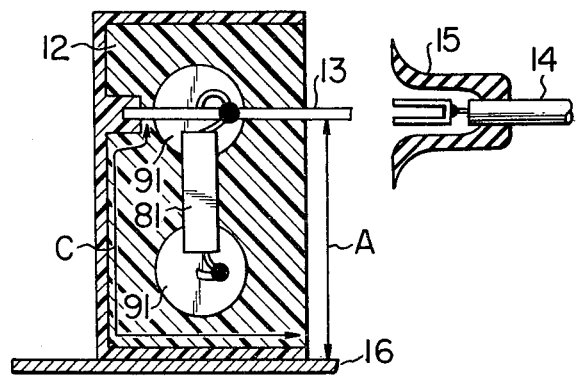

FIGS. 2 and 3 show, in a cross-sectional view, high voltage rectifying arrangement molded in a resin. Rectifiers 81 and high voltage condensers 91 constituting a voltage trebler rectifier circuit are molded with a molding material 12 of a thermo-setting resin such as epoxy resin in a case 11 formed of a thermo-plastic resin such as denatured polyphenylene oxide or polycarbonate. An input terminal 13 and an output terminal (not shown) are connected with the lead wires 14 from a flyback transformer and covered with rubber caps 15.

However, in the conventional structures shown in FIGS. 2 and 3, since the input terminal 13 is mounted directly on the case 11 and exposed, a discharge is apt to occur between the input terminal 13 and a chassis 16. In order to avoid the discharge it is necessary to make the creeping distance A sufficiently large. Moreover, since the case 11 is of a thermo-plastic resin and the molding material 12 is of a thermo-setting resin, the reliability of adherence between the case 11 and the molding material 12 is low. Consequently, in order to avoid the discharge it is also necessary to make the interface distances B and C sufficiently large. As a result, there has been the disadvantage that the size of the high voltage rectifying arrangement cannot be made small, and hence the minimum size of the television receiver is limited.

SUMMARY OF THE INVENTION

An object of the present invention is to provide a novel and useful high voltage rectifying arrangement.

Another object of the present invention is to provide a high voltage rectifying arrangement of a small size and capable of reducing the size of television receivers.

A further object of the present invention is to provide a high voltage rectifying arrangement without a discharge from its input terminal, rectifying exactly a necessary voltage, and capable of supplying the rectified voltage to a cathode-ray tube.

A still further object of the present invention is to provide a high voltage rectifying arrangement in which the insulation reliability is high in the combination of a thermo-plastic resin and a thermo-setting resin.

To achieve the above objects the high voltage rectifying arrangement according to the present invention is characterized in that the input terminal thereof is covered with a piece formed of a material having a good adherence to the molding material, which is in turn covered with an insulating rubber cap.

DESCRIPTION OF THE PREFERRED EMBODIMENTS

Figure 4:
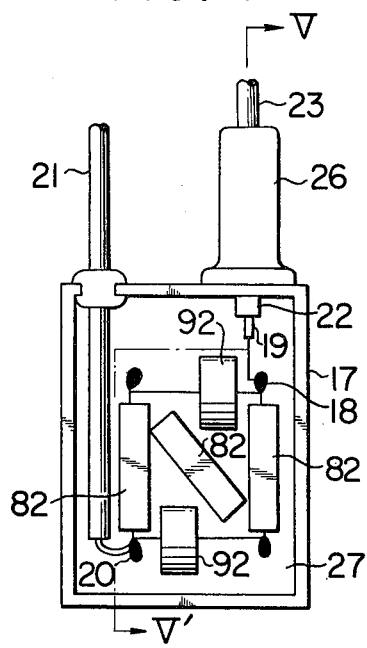
FIG. 4 is an elevational view of a high voltage rectifying arrangement according to the present invention.
Figure 5:
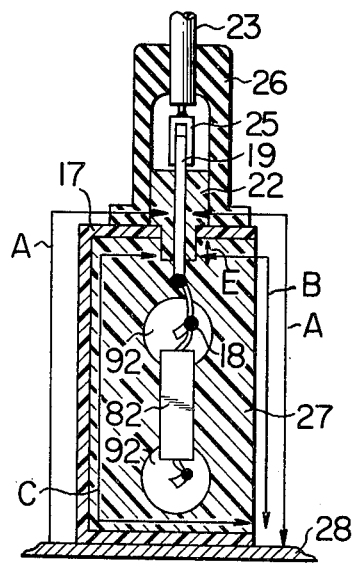
FIG. 5 is a cross-section taken along the line V – V' in FIG. 4.
Figure 6:
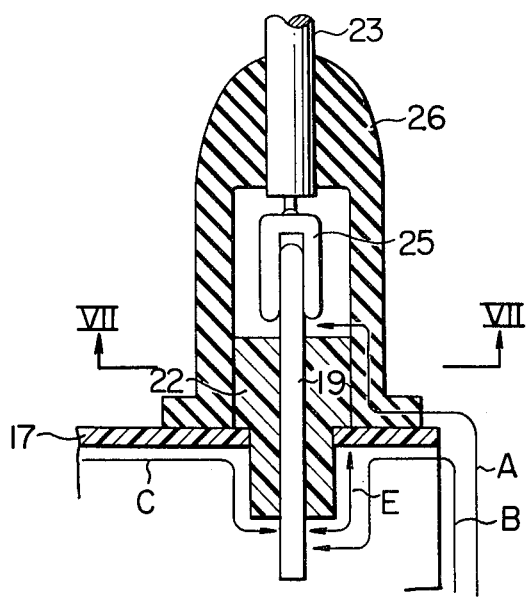
FIG. 6 is an enlarged view of an important part of FIG. 5.
Figure 7:
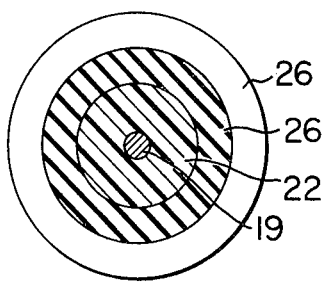
FIG. 7 is a cross-section taken along the line of VII – VII' in FIG. 6.

An embodiment of the present invention will be described with reference to FIG. 4. Reference numeral 17 designates a mold case made of a thermo-plastic resin, and reference numerals 82 and 92 designate rectifiers and high voltage condensers, respectively, constituting a voltage trebler circuit 7. One junction point 18 of the junction points between the rectifiers and the condensers is connected to an input terminal 19, and another junction point 20 is connected with an output lead wire 21. The input terminal 19 is fixedly led out by a fixing piece 22 as shown in FIGS. 5, 6, and 7.

The fixing piece 22 is of a spigot shape and is formed of the same kind of material as the molding material 27, that is, of the molding material 27 is an epoxy resin, the fixing piece 22 is also of an epoxy resin. A part of the fixing piece 22 is molded, together with the rectifiers 82, the condensers 92 and the input terminal 19, with the molding material 27 in the mold case 17. Since the fixing piece 22 and the molding material 27 are of the same kind of material, they adhere tightly to each other.

Figure 8:
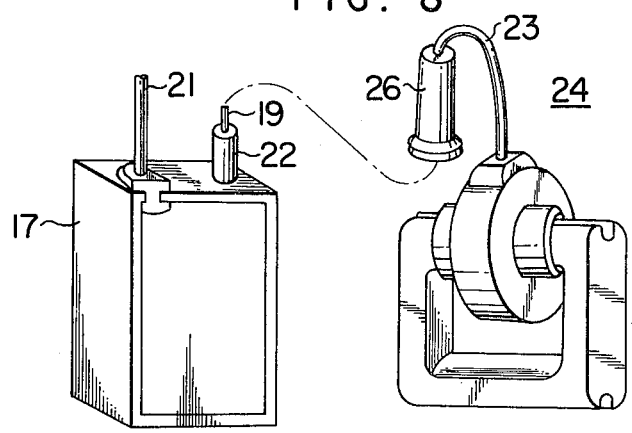
FIG. 8 is a perspective view showing a connection between the rectifying arrangement according to the present invention and a flyback transformer.

The input terminal 19 led out through the fixing piece 22 is fitted in a terminal cap 25 of a lead wire 23 from a flyback transformer 24 as shown in FIG. 8, whereby the high voltage rectifying arrangement and the flyback transformer 24 are electrically connected to supply a stepped-up A.C. voltage to the high voltage rectifying arrangement. The connection between the lead wire 23 and the input terminal 19 may be made by soldering the lead wire 23 directly to the input terminal 19. The junction part of the input terminal 19 and the lead wire 23 is covered with an insulating rubber cap 26 mounted around a part of the fixing piece 22 by pressing there-against so that the junction part is not exposed.

The thus constructed high voltage rectifying arrangement is mounted on a chassis 28 to be packaged in a television receiver.

Figure 9:
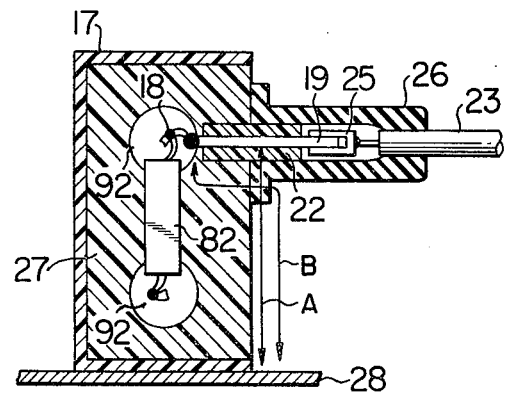
FIG. 9 is a cross-sectional view of another embodiment of the present invention.

The feature of the present invention is that in a high voltage rectifying arrangement the input terminal is led out in an fixed manner with a fixing piece formed of a material of the same kind as and having a good adherence to the molding material as described above. Consequently, the input terminal 19 can be led out from the mold face in which the fixing piece 22 is mounted in a floating manner on the molding material 27 as shown in FIG. 9.

Figure 10:
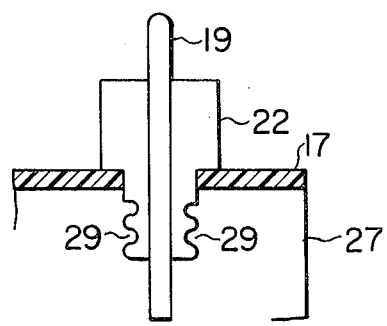
FIG. 10 is an enlarged cross-sectional view of an important part of a further embodiment of the present invention.

To improve the adherence between the fixing piece 22 and the molding material 27 and the voltage withstand property, corrugation 29 may be given to the surface of the part of the fixing piece 22 embedded in the molding material 27 as shown in FIG. 10.

Since, in the present invention, the input terminal is fixed by the fixing piece formed of a material tightly adhesive to the molding material both inside and outside the molding material as described above, that is, since the fixing piece is tightly adhered to the molding material at the interface E, the creeping discharges through the creeping distances B and C can be prevented, resulting in an improvement in the breakdown or withstand voltage of the mold case and the molding material. As a result, the creeping distance can be reduced. For example, it is possible in the present invention to reduce the creeping distance by more than 50 mm compared with a conventional one.

Moreover, since the present invention has the dual structure that the input terminal, the lead wire from the flyback transformer, and the junction thereof are covered with the insulating rubber cap outside the mold case in addition to the fixing piece, the discharge between the input terminal and the chassis can be prevented. For this reason, the creeping distance A can be reduced.

Thus, according to the present invention discharges between various parts can be prevented, enabling the miniaturization of the arrangement.

What is claimed is:

1. A high voltage rectifying arrangement for supplying a high D.C. voltage to a cathode-ray tube, said arrangement comprising:
   a plurality of rectifiers and high voltage condensers constituting a voltage multiplier rectifying circuit;
   a mold case made of an insulating material within which said rectifiers and condensers are provided;
   a molding material filled within said mold case so that said rectifiers and condensers are embedded in said molding material;
   an input terminal connected at one of its ends to said voltage multiplier rectifying circuit within said mold case;
   means for connecting said input terminal at the other of its ends to the output of a flyback transformer for supplying a high voltage flyback pulse to said rectifying circuit;
   a fixing piece formed of the same kind of material as said molding material for fixing said input terminal, said fixing piece having a first part buried in the molding material within said mold case, a second part projecting out from said molding material, and a bore passing through the first and second parts thereof so that said input terminal is embedded in and led out from said fixing piece at both of its ends through the bore of said fixing piece; and
   an insulating rubber cap pressed around said second part of said fixing piece for covering the junction of said input terminal and said output of said flyback transformer to thereby eliminate a leakage path at the junction between the fixing piece and the molding material.

2. A high voltage rectifying arrangement according to claim 1, in which the part of the fixing piece embedded in the molding material has a corrugated surface so as to increase the adherence between the part of the fixing piece with the corrugated surface and the molding material and also to increase the voltage withstand property.

3. A high voltage rectifying arrangement according to claim 1, in which said molding material has a surface exposed out of said mold case, said fist part of said fixing piece is secured to and embedded in said molding material at the exposed surface thereof without being supported by said mold case.

4. A high voltage rectifying arrangement according to claim 1, in which said first part of the fixing piece is supported by and projected into said mold case and said second part of said fixing piece is extended outwards from said mold case.

5. A high voltage rectifying arrangement according to claim 1, in which, said mold case is formed of a material different from that which said fixing piece and said molding material are formed.

* * * * *